United States Patent [19]

O'Dowd et al.

[11] Patent Number: 5,102,721
[45] Date of Patent: Apr. 7, 1992

[54] TEXTURED TIN OXIDE

[75] Inventors: James G. O'Dowd, Levittown; Anthony W. Cataiano, Furlong; Charles M. Fortmann, Langhorne; Ora J. Lee, Bristol, all of Pa.

[73] Assignee: Solarex Corporation, Rockville, Md.

[21] Appl. No.: 406,595

[22] Filed: Sep. 13, 1989

Related U.S. Application Data

[63] Continuation of Ser. No. 90,851, Aug. 31, 1987, Pat. No. 4,880,664.

[51] Int. Cl.⁵ .............................................. B32B 17/06
[52] U.S. Cl. .................... 428/212; 65/60.51; 427/109; 427/255; 427/255.3; 427/255.7; 427/419.3; 428/216; 428/426; 428/432; 428/688; 428/699; 428/701; 428/702
[58] Field of Search ............. 136/258 AM; 428/432, 428/426, 688, 699, 701, 702, 212, 216; 427/109, 255, 255.3, 255.7, 419.3; 65/60.51

[56] References Cited

U.S. PATENT DOCUMENTS

| | | | |
|---|---|---|---|
| 2,898,496 | 8/1959 | Clark, Sr. | 428/432 |
| 4,387,134 | 6/1983 | Kalbskopf et al. | 428/432 |
| 4,497,974 | 2/1985 | Deckman et al. | 136/258 |
| 4,500,743 | 2/1985 | Hayashi et al. | 136/258 |
| 4,514,582 | 4/1985 | Tiedje et al. | 136/258 AM |
| 4,532,537 | 7/1985 | Kane | 136/258 AM |
| 4,554,727 | 11/1985 | Deckman et al. | 136/258 AM |
| 4,568,578 | 2/1986 | Arfsten et al. | 428/432 |
| 4,689,438 | 8/1987 | Fukatsu et al. | 136/258 AM |
| 4,694,116 | 9/1987 | Hayashi et al. | 136/258 AM |
| 4,732,621 | 3/1988 | Murata et al. | 136/258 AM |

FOREIGN PATENT DOCUMENTS

| | | |
|---|---|---|
| 0234222 | 9/1987 | European Pat. Off. |
| 0141185 | 6/1986 | Japan . |
| 0073783 | 4/1987 | Japan . |
| 0219969 | 9/1987 | Japan . |
| 86/06658 | 11/1986 | World Int. Prop. O. |

Primary Examiner—Ellis P. Robinson
Assistant Examiner—Archene Turner
Attorney, Agent, or Firm—Finnegan, Henderson, Farabow, Garrett & Dunner

[57] ABSTRACT

A textured layer of tin oxide on a vitreous substrate in which the thickness and degree of texture of the layer can be controlled independently of one another. The tin oxide fabricated by a process comprising steps of depositing a first film of tin oxide on the substrate by chemical vapor deposition from a first reactant mixture of tin chloride, water, and an alcohol and depositing a second film of tin oxide on the first tin oxide film by chemical vapor deposition from a second reactant mixture of tin chloride and water. Where the substrate is ordinary soda lime glass, it preferably is first coated with a film of silicon dioxide. The process permits deposition of substantially uniform layers of tin oxide in a continuous deposition process.

5 Claims, 2 Drawing Sheets

TEXTURED TIN OXIDE

This is a continuation of application Ser. No. 90,851, filed Aug. 31, 1987, now U.S. Pat. No. 4,880,664.

BACKGROUND OF THE INVENTION

1. Field of the Invention

The present invention relates to a method of depositing a textured layer of transparent conductive material on a substrate. More particularly, the present invention relates to a method of controlling the texture of a tin oxide layer independently of the overall thickness of the layer.

2. Description of the Related Art

Many photovoltaic devices require the fabrication of a layer of transparent conductive material on a transparent substrate to provide an electrically conductive element on the light-entry surface of a semiconductor body that does not substantially interfere with propagation of light into the semiconductor body through the light-entry surface.

FIG. 1 shows a photovoltaic device 10 comprised of a plurality of series-connected photovoltaic cells 12 formed on a transparent vitreous substrate 14 and subjected to solar radiation 16 passing through substrate 14. Each photovoltaic cell 12 includes a front electrode 18 of transparent conductive oxide, a photovoltaic element 20 made of a semiconductor material, such as for example, hydrogenated amorphous silicon in a PIN structure, and a back electrode 22 of a metal such as aluminum. The back electrode 22 of each cell 12 is connected to the front electrode of an adjacent cell 12 by an interconnect portion 24.

Front electrodes 18 typically are formed by depositing a film of transparent conductive oxide, such as tin oxide ($SnO_2$), on a glass substrate 14 by chemical vapor deposition. The tin oxide film then is divided into a plurality of front electrodes 18 by removing narrow strips of material between the desired front electrodes. One such method for removing the strips of tin oxide is laser ablation.

The tin oxide film fabricated on the supporting substrate must, of course, permit light to propagate through to the photovoltaic semiconductor material (photovoltaic elements 20 in FIG. 1). The tin oxide layer also serves to conduct the charge carriers generated in the photovoltaic material out of the device. It is further desirable to provide a textured surface on the deposited tin oxide film to scatter light passing into the photovoltaic elements. Scattering the light at the interface between the tin oxide front electrodes 18 and the photovoltaic elements 20 increases the effective path length of light in the photovoltaic elements, thus increasing the probability that a photon will be absorbed and produce a free charge carrier.

As applied to the surface of a transparent conductive oxide layer, a "textured" surface has a dominant local peak-to-valley variation in height greater than about 0.2 micrometers. The textured surface is comprised of pyramidal microcrystallites ranging in size typically from about 0.1 to 1.5 micrometers in diameter as measured on scanning electron microscope (SEM) photographs.

One conventional method for fabricating a textured layer of tin oxide on a substrate is disclosed in U.S. Pat. No. 4,532,537, issued to Kane. Kane discloses a method of depositing a layer of textured tin oxide on a glass substrate by chemical vapor deposition from an atmosphere including tin, oxygen, hydrogen, and a conductivity modifying dopant such as fluorine. The primary reactants are tin chloride ($SnCl_4$) and water ($H_2O$), both of which are introduced by bubbling nitrogen ($N_2$) through the reactants. The substrate is held at an elevated temperature lower than the temperature at which the substrate softens. It is known that texture increases with an increase in deposition temperature.

The prior art textured tin oxide deposition method taught by Kane works well during batch processing. This method, however, is inadequate when applied to continuous processing, that is, when a plurality of substrates are successively moved through the deposition chamber along a belt or roller conveying apparatus. We have found that the method disclosed by Kane tends to produce non-uniform texture in a continuous deposition system and that the texture becomes increasingly non-uniform as the film thickness is increased.

Another disadvantage of the above-described prior art method is that texture is directly related to film thickness. Texture increases as the overall thickness of the tin oxide layer increases. Consequently, an overly thick film with poor optical qualities (i.e., decreased transparency) often results from an effort to increase the texture of a tin oxide layer. Furthermore, the electrical properties of the tin oxide layer vary with the layer's thickness. For example, sheet resistance is inversely proportional to layer thickness. The prior art methods of depositing textured tin oxide layers provide no means for producing, for example, a 15 $\Omega/\square$ layer and a 25 $\Omega/\square$ layer having comparable light-scattering properties. In designing photovoltaic devices, it is desirable to be able to adjust the thickness and texture of the tin oxide film independently of one another. Conventional deposition methods do not provide such a capacity.

The present invention is intended to provide a method of fabricating a substantially uniformly textured layer of tin oxide on a vitreous substrate in a continuous processing operation.

The present invention also is intended to provide a method of fabricating a textured layer of tin oxide on a vitreous substrate in which the degree of texture and thickness of the layer can be controlled substantially independently of one another.

Additional advantages of the present invention will be set forth in part in the description that follows and in part will be obvious from that description or can be learned from practice of the invention. The advantages of the invention can be realized and obtained by the method particularly pointed out in the appended claims.

SUMMARY OF THE INVENTION

The present invention overcomes the problems of the prior art methods of fabricating textured tin oxide layers on a vitreous substrate by depositing two films of tin oxide from separate reactant mixtures and activating nucleation of the tin oxide deposited in the first film by adding an alcohol to the first reactant mixture.

To overcome the problems of the prior art methods and in accordance with the purpose of the invention, as embodied and broadly described herein, the method of this invention of forming a textured layer of transparent conductive oxide on a vitreous substrate comprises the steps of depositing a first film of tin oxide on the substrate by chemical vapor deposition from a first reactant mixture of tin chloride, water, and an alcohol while holding the substrate at a preselected reaction temperature and depositing a second film of tin oxide on the first film by chemical vapor deposition from a second reactant mixture of tin chloride and water while holding the substrate at the preselected reaction temperature.

Where the substrate contains surface impurities, as in the case of ordinary soda lime glass, the method of this invention preferably comprises the additional step of depositing a film of silicon dioxide on the substrate prior to depositing the first film of tin oxide. The first tin oxide film then is deposited on the silicon dioxide film. Each of the first and second reactant mixtures preferably includes a conductivity modifying dopant, such as hydrofluoric acid.

The accompanying drawings, which are incorporated in and which constitute a part of the specification, illustrate at least one embodiment of the invention and, together with the description, explain the principals of the invention.

DESCRIPTION OF THE PREFERRED EMBODIMENTS

Reference now will be made in detail to the presently preferred embodiment of the invention.

The present invention provides a method for depositing a layer of tin oxide on a vitreous substrate by reacting tin chloride and water at the surface of the substrate in a continuous processing operation so that the resulting tin oxide layer is uniformly textured across the area of the substrate and the layer is free from visible cosmetic defects.

In understanding this invention, it is important to distinguish between "haze" and "texture." Haze is an unavoidable consequence of tin oxide deposition and refers to a slight surface topography that is a function of the thickness of the tin oxide layer. A tin oxide layer having a thickness of one micrometer typically will have a surface topography having microcrystallites less than 0.1 micrometer in diameter. The term texture applies to films having surface features greater that 0.2 micrometers. The distinction between textured and hazy tin oxide layers is important in terms of their optical properties. When applied to photovoltaic cells otherwise identical in structure, the cell having a textured tin oxide layer on the light entry side of the photovoltaic elements will have a much larger efficiency than an identical photovoltaic cell having a hazy layer tin oxide because the textured layer will provide effective scattering of light.

As used herein, the term "scattered transmission" is defined as the percentage of light energy incident on a coated substrate that is transmitted through the substrate at all non-incident angles. Hazy tin oxide layers typically have a scattered transmission of less than 1% for light having a wavelength of 700 nm. Textured layers scatter more than 1% of incident light at 700 nm. For a given film, the value of scattered transmission normally decreases with increasing wavelength.

The method of this invention for fabricating a layer of textured tin oxide on a substrate is primarily a two-step process. The first step includes depositing a first film of tin oxide on a substrate by a chemical vapor deposition (CVD) reaction between tin chloride and water that is moderated by the addition of trace amounts of alcohol to the reaction. The second step includes depositing a second film of tin oxide on the first tin oxide film by CVD from a reactant mixture of tin chloride and water without moderation with alcohol. The texture of the overall tin oxide layer is controlled primarily by selecting the proper ratio between the thickness of the first film and the thickness of the second film.

Figure 2:
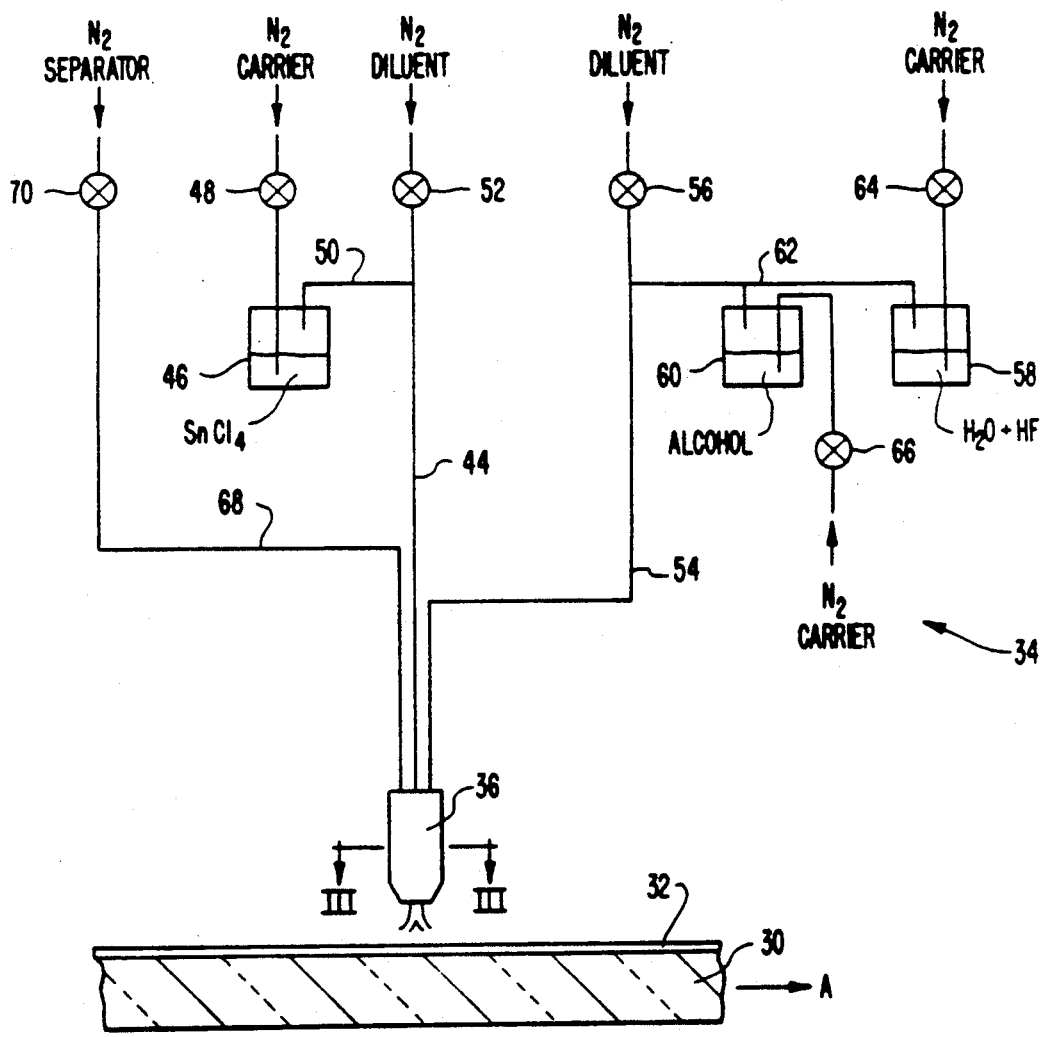
FIG. 2 is a schematic diagram of an apparatus used for depositing a layer of textured tin oxide in accordance with the method of this invention.

The method of the present invention now will be described with reference to the apparatus shown in FIGS. 2 and 3 of the drawings. FIG. 2 is a schematic representation of a vitreous substrate 30 being conveyed in the direction of arrow A in a deposition chamber containing a CVD system 34.

In accordance with the presently preferred embodiment of the invention, a flat substrate 30 of ordinary soda lime glass first is coated with a film of silicon dioxide ($SiO_2$). We have found that uniform deposition of tin oxide on ordinary soda lime glass is difficult because of impurities that normally exist on the surface of such low-grade vitreous substrates. When deposited directly on ordinary soda lime glass or lower-grade Pyrex ®, the tin oxide layer tends to be nonuniform and contain numerous pinholes and other blemishes. Furthermore, the nucleation of the tin oxide on the substrate has been found to be a function of the glass manufacturing process; substrates obtained from different glass vendors might provide different textured coatings despite holding the tin oxide deposition parameters constant.

The silicon dioxide film 32 provides the surface with a chemically uniform, reproducible surface coating so that the subsequent tin oxide reaction, which is a surface reaction, produces a tin oxide layer of uniform thickness and texture. The thickness of the silicon dioxide film does not appear to be critical, and we have found that silicon dioxide films having thicknesses of 30-600 nanometers provides a proper surface for uniform deposition of textured tin oxide.

When tin oxide is deposited in accordance with the present invention on a substrate formed of a more expensive and impurityfree material, such as quartz, Corning ® 7059 glass or highergrade Pyrex ®, the substrate surface normally is sufficiently free of defects that a uniform tin oxide layer can be deposited directly on the substrate without an intervening silicon dioxide film.

The silicon dioxide film can be deposited by any conventional method, for example, by using a chemical injector such as a Watkins-Johnson Model No. 968587. The chemical reaction producing the silicon dioxide film 32 preferably occurs at the surface of the glass rather than at the injector nozzle or in the gas phase.

In accordance with the invention, substrate 30 (coated, if necessary, with silicon dioxide film 32 where substrate 30 is comprised of ordinary soda lime glass) is conveyed through a first deposition chamber in which a first film of tin oxide is deposited on the substrate by chemical vapor deposition from a first reactant mixture of tin chloride, water, and an alcohol while holding substrate 30 at a preselected reaction temperature. Suitable alcohols include the lower alkanols, that is, methanol, ethanol, propanol, butanol, and mixtures thereof. In the presently preferred embodiment, the alcohol constituent of the first reactant mixture is methanol. Similar results have been obtained with propanol and butanol as the reaction moderator. We would expect other alcohols, such as ethanol or hexanol, also to be suitable substitutes for methanol.

Figure 1:
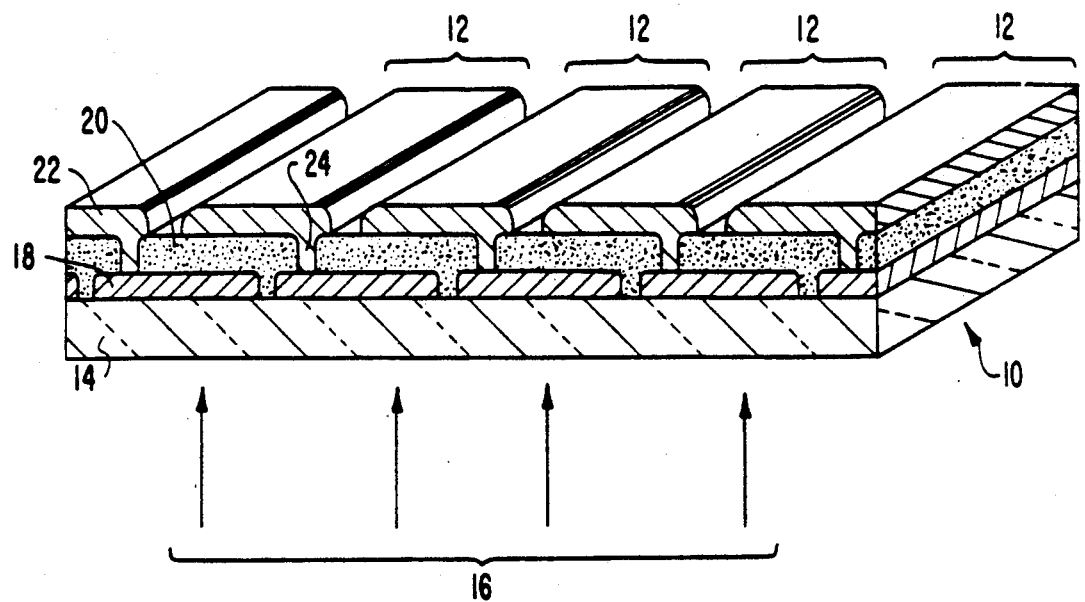
FIG. 1 is a schematic perspective view of a thin-film photovoltaic semiconductor device having transparent electrodes formed from tin oxide.
Figure 3:
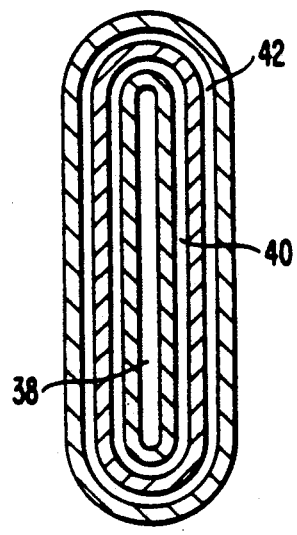
FIG. 3 is a schematic cross-sectional view of the injector of the apparatus shown in FIG. 2 taken along line III—III of FIG. 2.

In accordance with the invention and with specific reference to apparatus 34 shown in FIGS. 2 and 3, the tin oxide, water, and alcohol are brought together in dilute form by a carrier gas, preferably nitrogen, at an injector 36. Injector 36 is sized to deliver the reactants to an injection zone spanning the width of substrate 32 passing beneath it. As shown in FIG. 3, injector 36 has three concentric jets 38, 40, and 42. Jets 38, 40, 42 direct the constituents of the first reaction mixture onto the surface of substrate 32, which is held at a preselected reaction temperature preferably above 500° C. When depositing on a soda lime glass substrate the maximum reaction temperature should be about 540° C. to prevent thermal warping of the substrate. The tin chloride and water react at the surface of the substrate to form tin oxide in accordance with the following chemical reaction:

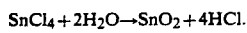

$SnCl_4 + 2H_2O \rightarrow SnO_2 + 4HCl$.

Central jet 38 directs a mixture of nitrogen and tin chloride onto substrate 32 via conduit 44. A nitrogen carrier gas is passed through a first bubbler 46 containing tin chloride held at a constant temperature, preferably at about 34° C. The flow rate of the nitrogen carrier gas passing through the tin chloride is regulated by a flow meter (not shown) and is controlled by control valve 48. Output conduit 50 of first bubbler 46 is connected to conduit 44. Conduit 44 contains nitrogen diluent gas flow controlled by control valve 52 and regulated by a flow meter (not shown).

In accordance with the invention, a mixture of alcohol and water is conducted to outer jet 42 of injector 36 by conduit 54. Nitrogen diluent flow is introduced into conduit 54 through control valve 56. The nitrogen diluent gas flows supplied through control valves 52 and 56 ensure that the reactant mixture at injector 36 has sufficient gas velocity. The water and alcohol are introduced into conduit 54 through second and third bubblers 58 and 60, respectively. Second and third bubblers 58, 60 have a common output conduit 62, which connects to conduit 54. Second bubbler 58 contains water held at an elevated temperature, preferably about 80° C., and preferably contains 1 part concentrated hydrofluoric acid (HF) to 99 parts water to provide fluorine doping in the resulting tin oxide film. A nitrogen carrier gas controlled by control valve 64 carries water vapor to output conduit 62. The alcohol held in third bubbler 60 preferably is methanol held at a temperature of approximately 4° C. and is introduced into output conduit 62 by nitrogen carrier gas controlled by control valve 66.

In accordance with the invention, a separator gas flow of nitrogen is carried to intermediate jet 40 by conduit 68. The flow of the separator gas is controlled by a control valve 70. The separator gas prevents the reactants from reacting at and clogging injector 36. As an alternative to introducing hydrofluoric acid to the water in bubbler 58, fluorine doping of the tin oxide can be accomplished by adding hydrogen fluoride gas to nitrogen conduit 68.

As is well known in the art, a CVD reaction between the hydrofluoric acid-containing water and tin chloride (or water and tin chloride in the presence of hydrogen fluoride gas) at heated substrate 30 will produce a tin oxide film doped with fluorine on substrate 30. The introduction of alcohol at a molar ratio preferably less than or equal to about 1:4 based on the total reactant mixture moderates the tin chloride-water reaction to produce a uniform first film of tin oxide on top of silicon dioxide film 32 (or directly on a substrate comprised of quartz or Corning® 7059 glass, both of which are essentially $SiO_2$). More preferably, the molar flow ratio of alcohol to total reactact mixture for the first tin oxide film is less than or equal to about 1:20. In the absence of alcohol in the reaction, the tin oxide formed on the moving substrate is non-uniform and typically results in alternating light and dark stripes. In effect, the striped tin oxide layer exhibits excessive, uncontrolled texture. We believe that the absence of defects in the silicon dioxide surface inhibits uniform nucleation of tin oxide on the surface.

Nucleation of the tin oxide is activated by adding alcohol to the reaction. It is believed that the alcohol acts as a surface catalyst allowing formation of $SiO_2$:-$SnO_2$ bonds. Although the first film of tin oxide fabricated in accordance with the invention is specular, that is, does not have significant surface texture, varying the concentration of the alcohol in the reaction mixture changes the degree of microstructure of the final textured tin oxide coating.

In accordance with the invention, a second film of tin oxide then is fabricated on the first tin oxide film in a second deposition chamber using the same apparatus as shown in FIG. 2 with the exception of third bubbler 60. No alcohol is contained in the reactant mixture forming the second tin oxide film. As indicated above, the second tin oxide film has a textured surface with the extent of texture being a function of the amount of alcohol used in the first tin oxide film reaction. The degree of surface texture decreases as the amount of alcohol in the first reactant mixture increases. Alcohol is not required to moderate the deposition of the second tin oxide film because the first tin oxide film provides a surface willing to accept tin oxide deposition in a manner believed to be similar to epitaxial growth.

As is well known in the art, the deposition chambers must be isolated from the outside atmosphere. Isolation preferably is provided by nitrogen curtains at the entrance of each deposition chamber. Preferably, nitrogen curtains comprise nitrogen gas flowing at about 15 liters/minute. The chambers also must be exhausted to remove by-products of the CVD reaction.

Tin oxide layers having a sheet resistance of approximately 5–70 $\Omega/\square$ have been deposited using water/methanol molar flow ratios of 1/10 to 1000/1 and using water/tin chloride molar flow ratios of 2/1 to 30/1 in depositing the first tin oxide film and using water/tin chloride molar flow ratios of 2/1 to 30/1 during deposition of the second tin oxide film. For large-area solar panels, the desired sheet resistance of the tin oxide layer typically is about 9–16 $\Omega/\square$.

By depositing a tin oxide layer in the two-step fashion described above, the texture and thickness of the resulting tin oxide layer can be controlled independently of one another. As stated above, decreasing the proportionate amount of alcohol in the reaction producing the first tin oxide film increases the texture of the resulting layer. For a given thickness of tin oxide, increasing the amount of tin chloride (and the resulting film thickness) in the first deposition step relative to the amount of tin chloride in the second deposition step will decrease the texture. The overall thickness of a layer (and hence its conductivity) can be varied by increasing or decreasing the thicknesses of both tin oxide films.

The advantages of the present invention are illustrated further by the following examples.

EXAMPLE I

A layer of tin oxide was deposited on a rectangular glass substrate coated with silicon dioxide according to the method of this invention using the reactant molar flows set forth in Table I. The substrate measured approximately 30 cm by 33 cm. The substrate was held at a reaction temperature of about 540° C. Watkins-Johnson Model No. 968587 CVD injectors were used to deposit the tin oxide. The substrate was conveyed through two deposition chambers on a conveyor belt moving about 15 cm/min. A first tin oxide film was deposited on the substrate in chamber 1 in a reaction moderated by methanol. A second tin oxide film was deposited on the first tin oxide film in chamber 2 in a reaction without methanol.

TABLE I

| Reactant | Molar Flow (moles × $10^{-2}$/min) | |
|---|---|---|
|  | Chamber 1 | Chamber 2 |
| $SnCl_4$ | 0.516 | 0.258 |
| $H_2O$ | 9.730 | 4.040 |
| $CH_3OH$ | 0.190 | — |
| HF | 0.017 | 0.017 |

The ratio of tin chloride flow in chamber 1 to tin chloride flow in chamber 2 was approximately 2:1. The total molar tin flow was 0.0077 mole/min, which resulted in a total layer thickness of about 1.2 micrometers. The molar percentage of methanol in the reactant mixture in chamber 1 was about 1.82%. The resulting tin oxide layer had a sheet resistance of about 9.9 $\Omega/\square$ and a scattered transmission of about 5.3% at 700 nm.

EXAMPLE II

A tin oxide layer was deposited in accordance with the invention on a 30 cm by 33 cm silicon dioxide-coated glass substrate under the same deposition conditions as for Example I, except that the molar flows of the reactants were revised to have a greater tin chloride flow during the deposition of the second film than during deposition of the first film. The molar flows for Example II are set forth in Table II.

TABLE II

| Reactant | Molar Flow (moles × $10^{-2}$/min) | |
|---|---|---|
|  | Chamber 1 | Chamber 2 |
| $SnCl_4$ | 0.194 | 0.580 |
| $H_2O$ | 3.660 | 9.040 |
| $CH_3OH$ | 0.145 | — |
| HF | 0.017 | 0.017 |

The ratio of tin chloride flow in chamber 1 to tin chloride flow in chamber 2 was approximately 1:3. The total molar tin flow was 0.0077 mole/min, the same as for Example I, which resulted in a total thickness of approximately 1.4 micrometers. The molar percentage of methanol in the reactant mixture in chamber 1 was about 3.61%. The resulting tin oxide layer had a sheet resistance of about 15 $\Omega/\square$ and a scattered transmission of about 9.1% at 700 nm. In comparison to the layer deposited in Example I, this example exhibited substantially greater light scattering with no significant increase in film thickness by virtue of decreasing the thickness of the methanol-moderated film.

EXAMPLE III

A tin oxide layer was deposited in accordance with the method of this invention on a 30 cm by 33 cm silicon dioxide-coated Pyrex ® substrate held at a reaction temperature of about 600° C. As with Examples I and II, Watkins-Johnson Model No. 968587 CVD injectors were used, and the substrate was conveyed through the two deposition chambers at a rate of about 15 cm/min. The reactant molar flows used to deposit Example III are set forth in Table III.

TABLE III

| Reactant | Molar Flow (moles × $10^{-2}$/min) | |
|---|---|---|
|  | Chamber 1 | Chamber 2 |
| $SnCl_4$ | 0.0595 | 0.357 |
| $H_2O$ | 0.532 | 3.20 |
| $CH_3OH$ | 0.0264 | — |
| HF | 0.00132 | 0.00666 |

The ratio of tin chloride flow in chamber 1 to tin chloride flow in chamber 2 was approximately 1:6. The total molar tin flow was 0.0042 mole/min, which resulted in a total layer thickness of approximately 0.7 micrometers. A tin oxide layer of this thickness is desirable in certain photovoltaic devices, such as stacked junction devices. The molar percentage of methanol in the reactant mixture of chamber 1 was about 4.26%. Despite its decreased thickness, the tin oxide layer of this example had a scattered transmission of about 8% at 700 nm by virtue of the substantially greater thickness of the second film relative to the first film. The sheet resistance for the layer was about 26 $\Omega/\square$.

It will be apparent to those skilled in the art that modifications and variations can be made in the method of this invention without departing from the scope of the invention. For example, alcohols other than methanol, such as propanol, butanol, or ethanol, can be used to moderate the tin chloride/water reaction during deposition of the first film. In addition, a tin oxide layer can be deposited without fluorine doping by omitting hydrogen fluoride from the reactions. The invention in its broader aspects is, therefore, not limited to the specific details and illustrated examples shown and described. Accordingly, it is intended that the present invention cover such modifications and variations provided that they fall within the scope of the appended claims and their equivalents.

What is claimed:

1. A vitreous substrate having a textured transparent conductive layer disposed thereon, fabricated by a process comprising the steps of:
   depositing a first film of tin oxide on said substrate by chemical vapor deposition from a first reactant mixture comprising tin chloride, water, and alcohol while holding said substrate at a pre-selected reaction temperature, said first film having a substantially smooth surface; and
   depositing a second film of tin oxide on said first tin oxide film by chemical vapor deposition from a second reactant mixture free of alcohol and comprising tin chloride and water while holding said substrate at said preselected reaction temperature, said second film having a textured surface.

2. The substrate of claim 1, wherein said transparent conductive layer has a sheet resistance of approximately 5-70 Ω/□.

3. The substrate of claim 1, wherein said transparent conductive layer has a sheet resistance of approximately 9-16 Ω/□.

4. The substrate of claim 1, wherein said transparent conductive layer has a thickness of less than about 1.5 micrometers and a scattered transmission of more than about 5% at 700 nm.

5. The substrate of claim 4, wherein said transparent conductive layer has a sheet resistance in the range of 9-16 Ω/□.

* * * * *